United States Patent
Neumeier et al.

(10) Patent No.: US 6,451,668 B1
(45) Date of Patent: Sep. 17, 2002

(54) METHOD OF PRODUCING CALIBRATION STRUCTURES IN SEMICONDUCTOR SUBSTRATES

(75) Inventors: Karl Neumeier, Unterhaching; Dieter Bollmann, München, both of (DE)

(73) Assignee: Fraunhofer Gesellschaft zur Förderung der angewandten Forschung e.V., München (DE)

( * ) Notice: Subject to any disclaimer, the term of this patent is extended or adjusted under 35 U.S.C. 154(b) by 0 days.

(21) Appl. No.: 09/868,174

(22) PCT Filed: Nov. 26, 1999

(86) PCT No.: PCT/DE99/03796
§ 371 (c)(1),
(2), (4) Date: Jul. 12, 2001

(87) PCT Pub. No.: WO00/36383
PCT Pub. Date: Jun. 22, 2000

(30) Foreign Application Priority Data

Dec. 15, 1998 (DE) .......................... 198 57 742
Mar. 25, 1999 (DE) .......................... 199 13 612

(51) Int. Cl.$^7$ ............................... H01L 21/76
(52) U.S. Cl. ............... 438/401; 438/406; 438/422; 438/456; 438/475
(58) Field of Search ................. 438/401, 406, 438/422, 456, 459, 975

(56) References Cited

U.S. PATENT DOCUMENTS 5,266,511 A * 11/1993 Takao ............... 148/DIG. 12
5,335,550 A * 8/1994 Satou ...................... 73/727
5,369,050 A * 11/1994 Kawai ..................... 438/401
5,436,173 A * 7/1995 Houston ............ 148/DIG. 12
5,952,694 A * 9/1999 Miyawaki et al. ........ 257/347

FOREIGN PATENT DOCUMENTS

DE          42 23 445        * 10/1993

* cited by examiner

*Primary Examiner*—Trung Dang
(74) *Attorney, Agent, or Firm*—Breiner & Breiner, L.L.C.

(57) ABSTRACT

The invention relates to a method of producing calibration structures in semiconductor substrates in the manufacture of components, specifically micro-mechanical systems with integrated semiconductor electronic systems. In the method a first layer (3) is structured on a first substrate (4, 5, 6) to produce first areas (2) which are required for the function of the components. Moreover, second areas (1) are produced in the first layer (3), which represent the calibration structures. The second areas (1) present a refractive index different from the refractive index of adjoining areas. Subsequently, the first substrate (4, 5, 6) is joined with a second substrate (12) such that the first layer (3) will be enclosed between the two substrates. Then either the first or the second substrate is thinned down to a residual thickness. The substrate layer with this residual thickness constitutes, for instance, the membrane in a pressure sensor. The inventive method does not entail a weakening of the mechanical properties of supporting layers. The method may be integrated into the manufacturing process without additional process steps or complex and expensive etching techniques.

13 Claims, 2 Drawing Sheets

Figur 1
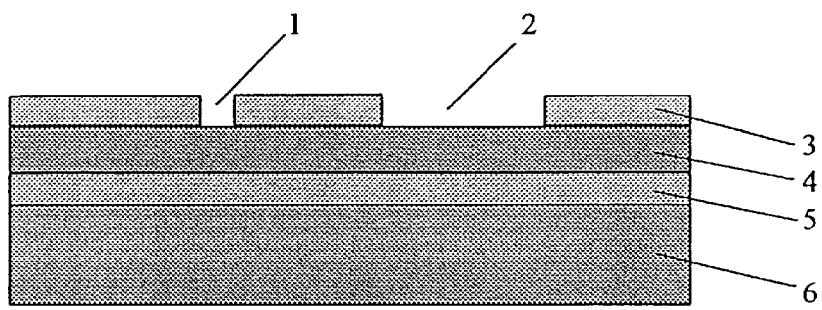
Figur 2
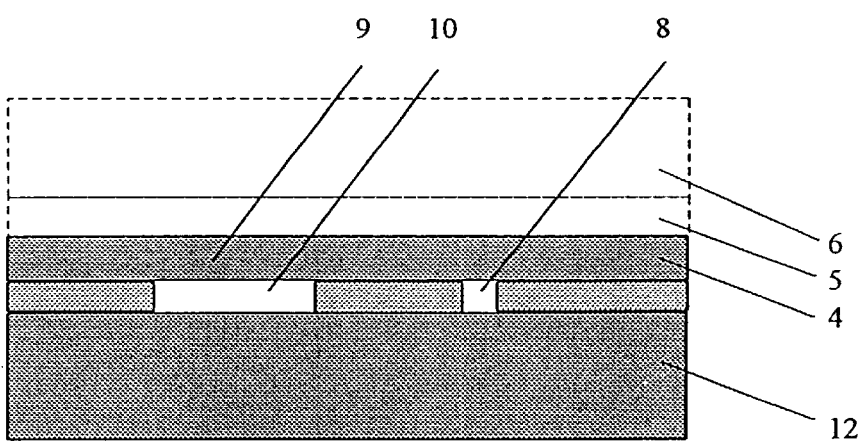
Figur 3
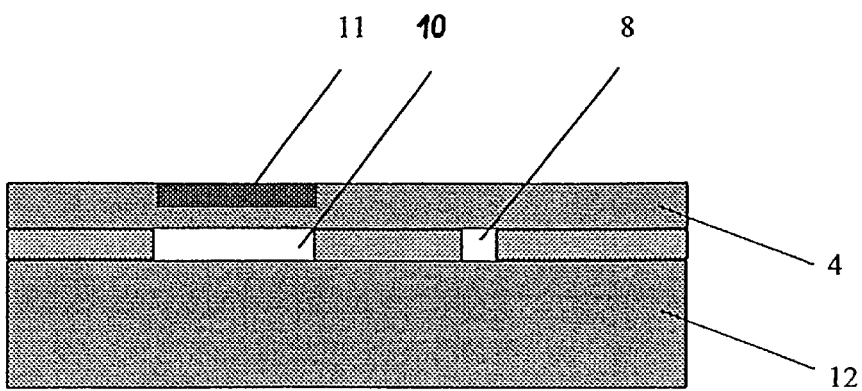

Figur 4
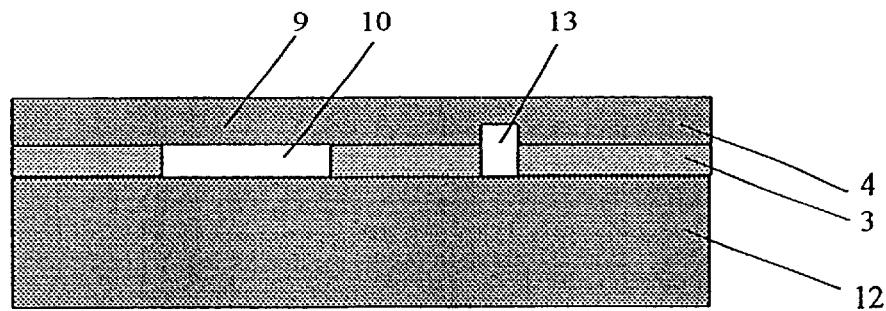
Figur 5
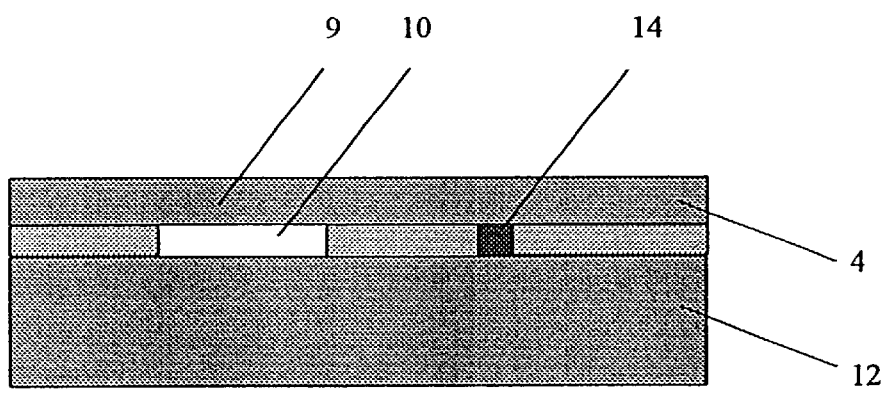
Figur 6
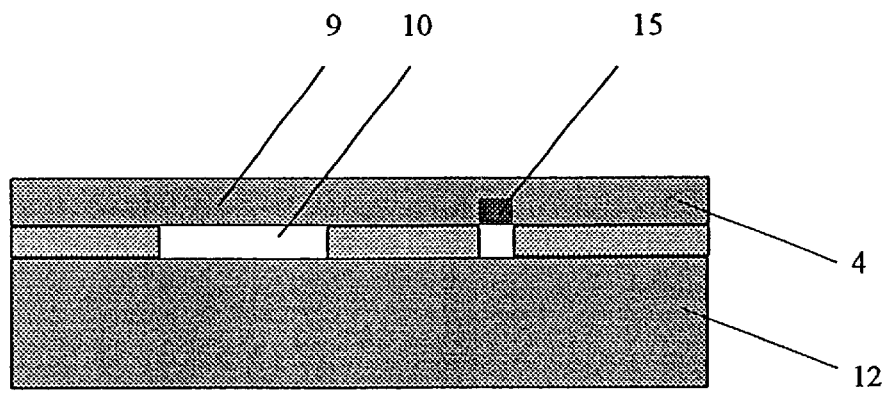

METHOD OF PRODUCING CALIBRATION STRUCTURES IN SEMICONDUCTOR SUBSTRATES

BACKGROUND OF THE INVENTION

The present invention relates to a method of producing calibration structures in semiconductor substrates in the manufacture of components, particularly the production of micro-mechanical systems with integrated electronic semiconductor systems. The inventive method offers particular advantages in the application of photo-litho-graphic techniques in the processing of silicon wafers.

In the production of semiconductor components or sensor systems including micro-electronic and micro-mechanical components several layers or strata of different functions are, as a rule, superimposed and structured on a semiconductor wafer. For the proper operation of the later component it is necessary that the structures of the individual layers present a predetermined position relative to the respective structures underneath. The layers are, as a rule, structured by means of a litho-graphic technique in which the applied exposure equipment such as steppers or contact exposure devices, with the corresponding masks are precisely positioned relative to the layer or existing structure to be exposed. Adjustment or calibration markers are used for positioning. The creation of these calibration markers or structures is the subject matter of the present invention.

A preferred field of application of the inventive method is the production of micro-electronically integrated sensors or actuators. Micro-electronically integrated sensors measure a physical or chemical condition in the environment and process it to generate an electrical signal. Micro-electronically integrated actuators convert an electrical signal into a mechanical movement or an acoustic signal.

A pressure sensor should be quoted here as an example, wherein a silicon layer over a cavity serves as membrane on the principle of a box-type barometer or barometric cell. Examples of pressure sensors and their production are known from the German Patent DE 37 43 080 A1. An integrated transducer detects the movement or the bending condition of the membrane and provides a corresponding electrical signal. These sensors, which present a cavity under a semiconductor layer, are also suitable for the highly responsive measurement of temperature, radiation, mechanical movement (vibration, sound, acceleration and rotation) as well as of the dynamic or chemical properties (such as fluidity, viscosity, flow rate, pH level, electrochemical potential) of the surrounding medium.

Like in the case of an exemplary pressure sensor, the cavity under the membrane may be evacuated or contain an optional medium, i.e. a gas, a liquids or a solid material, as far as this medium is compatible with the manufacturing technology to be applied, specifically the high temperatures occurring in such manufacture.

The membrane consists in many cases of a mono-crystalline silicon layer because its physical properties can be reproduced very well and are known. The silicon layer may be a mono-crystalline or a deposited and re-crystallised silicon layer. For special applications the membrane may also consist of other forms of silicon, such as amorphous or poly silicon, of another semiconductor material such as germanium, gallium arsenide or other Ill-V semiconductors, or an isolator such as silicon dioxide, silicon nitride, tantalum oxide or titanium nitride, as far as these substances are compatible with the technology to be applied.

The transducer for detection of the bending condition of the membrane is composed, for instance, of an array of piezo-resistive resistors converting the mechanical strain in the silicon membrane, which results from bending, into electrical signals. These signals can be amplified, processed, compensated for interfering influences, converted into analog or digital signals and processed by a micro-electronic circuit produced in the same silicon layer. The transducers may also consist of wire strain gauges, piezo-electric, capacitive or chemo-electrical converters. The circuit and the transducers may be manufactured in an appropriate micro-electronic technology (bi-polar, BICMOS, CMOS, etc.), depending on the respective application.

In the production of such a sensor, which is composed of different layers or planes, in CMOS technique, first of all the first plane is exposed in a non-calibrated form because the process starts with blank silicon wafers. The exposure equipment, e.g. a stepper or contact exposure device, is here only roughly oriented in the range of +/−100 μm by mechanically striking against the edges of the wafer. All following planes are calibrated directly or indirectly with a high precision relative to this first plane. In a semiconductor process operating on structure sizes of 0.8 μm this calibration must be performed, for example, with a precision of +/−0.3 μm. In order to be able to utilize the precision of the stepper also for the positioning of the transducers relative to the cavities it is necessary that calibration markers can bee detected for the stepper during the exposure of the first CMOS plane, which markers were generated before in the definition of the cavities. The application of the calibration markers serves the purpose of positioning the transducers with the accuracy common in CMOS processes. Simulation calculations by the FEM method have furnished the resuit that with this precision the distribution of the electrical output signals remains below 2% of the measured value. The remaining distribution due to manufacture may be compensated by a logic circuit integrated into the chip.

For the production of the cavities underneath the membrane it is possible, for instance, to deposit a thin oxide layer on a wafer. Large-area recesses are produced in this oxide layer by etching, with application of a photo-lithographic technique; these recesses define the cavities for the sensors. Then a second silicon wafer is connected to the first wafer by bonding so that the cavities are created instead of the recesses. Then the first wafer is thinned from the rear side such that a surface of the silicon or SOI layer is exposed. The second wafer assumes the function of the substrate wafer. The part of the silicon layer above the cavity becomes the membrane of the sensor. The exposed surface of the silicon layer is processed further in the subsequent semiconductor production for integration of the transducers or other micro-electronic circuit elements.

The German Patent DE 195 43 893 C1 discloses a method of aligning structures to be produced in a substrate, wherein calibration markers are used for calibration of the CMOS planes elative to the cavities in the production process outlined in the foregoing. In this method the calibration markers are etched as trenches into the surface of the first wafer and subsequently filled with a suitable material. The calibration markers and lines required by the stepper are copied. The trenches extend into the first wafer down to a depth that corresponds at least to the remaining thickness of the wafer thinned in a subsequent step so that they penetrate through the thinned silicon layer completely. The markers are therefore clearly visible on the new surface after re-thinning of the wafer. The demands to adjustability are hence satisfied.

One disadvantage of this trench process for the creation of the calibration markers is the necessity of additional process steps. These process steps are required, on the one hand, in order to achieve the deeper depth of the trenches, compared against the cavity structures. On the other hand, the trenches must be additionally filled with a suitable material.

Another disadvantage of this method consists in the requirement of a specific trench-etching process in order to be able to create the trenches in the silicon wafer with a sufficient steepness of the flanks. Moreover, a complex masking layer is required which must resist the intensive plasma etching operation and which is then removed.

A particular disadvantage resides in the aspect that the complete etching of the SOI layer through the layer with subsequent filling results in a weakening of the mechanical properties of the layer and gives rise to mechanical strain in subsequent temperature steps. With the cavities and the joining CMOS planes being calibrated on an auxiliary plane, the resulting precision in calibration is deteriorated.

SUMMARY OF THE INVENTION

The present invention is now based on the problem of providing a method of producing calibration structures in the production of components, which do not give rise to weakening of the mechanical properties of supporting layers, which method is suitable for integration into the manufacturing process without additional process steps or complex etching techniques.

This problem is solved with the method according to claim 1. Expedient embodiments or improvements of the method are the subject matters of the dependent claims.

The invention preferably relates to the production of calibration structures for photo-lithography in silicon wafers. The structures are based on a local variation of the refractive index or the attenuation within or underneath a thin silicon layer so that the topography of the wafer surface will not be varied or influenced. The calibration structures are visible for an exposure equipment under red or infra-red light and particularly in dark field illumination.

The inventive method is appropriate, for example, for the manufacture of micro-electronically integrated sensors and actuators on the basis of SOI wafers with buried cavities and integrated electronic analyzer circuits in CMOS technology.

In the method a first substrate, preferably a wafer, is provided on which a first layer is formed. The first layer, e.g. an oxide layer, is structured to produce first areas required for the functioning of the components. In the case of pressure sensors, these first areas are recesses constituting the cavities of the later pressure sensors. Before, after or simultaneously with this structuring of the first areas second areas are produced in the first layer, which represent the calibration structures. These second areas penetrate through the first layer complete. If required, they may extend into the first substrate located under the first layer up to a certain depth. The depth must, however, be smaller than the thickness of the first substrate. When the first substrate is thinned from the rear side in a further step the depth of the second areas in the first substrate must be shorter than the thickness of the thinned first substrate. The second areas present a refractive index different from the refractive index of adjoining areas. This can be achieved, on the one hand, by the provision that the areas are configured as recesses forming an evacuated or gas-filled cavity in the subsequent steps. In a further step, however, the recesses may be filled with a material having a refractive index differing from the index of the surrounding material. To this end preferably a material is used whose difference from the surrounding material in terms of the refractive index is greater than the difference in terms of the refractive index between air or vacuum and the surrounding material. In the case of a silicon oxide layer as the first layer on a silicon wafer, for example, a metal such as tungsten may be used as such a material. An area presenting a different refractive index can, of course, also be produced by implanting suitable ions or atoms into the first layer. After production of the first and second areas the first substrate is joined with the second substrate so that the first layer is enclosed between the two substrates. Suitable joining techniques are common to those skilled in the art. Then either the first or the second substrate is thinned down to a remaining or residual thickness from the exposed side. The substrate layer with this residual thickness constitutes, for example, the membrane in a pressure sensor. This reduction of the thickness may be performed in a common manner by grinding, polishing, CMP or etching.

In a preferred embodiment of the inventive method, wherein the first areas required for the proper functioning of the component represent recesses in the first layer, the second areas are equally produces as recesses in the first layer in the same step of operation. With these provisions it is possible to provide also the calibration structures simultaneously with the etching process required for the first areas. Hence an additional step of operation is not necessary.

The inventive method for calibration avoids the modification so far necessary to protect the silicon surface exposed after bonding and thinning. Therefore, any inexpedient contamination of the silicon cannot occur.

The structures required for calibration, such as crosses and groups of lines, are produced simultaneously with the functional structures of the component, e.g. the cavities in a pressure sensor, or in an additional step by structuring the first layer.

In the production of calibration structures by application of the inventive method, the thinned substrate layer above the calibration structures is rigid, compared against the layer areas above the cavities used as sensors, so that the effect to be measured will not be influenced by the calibration structures. Any weakening of the mechanical properties of the layer by the calibration structures does not occur.

If the exposure equipment requires two-dimensional calibration markers it is possible to copy the contour of these areas by grooves in side-by-side arrangement. The width of the elongate grooves is preferably in or below the range of the thickness of the first layer. Two-dimensional calibration markers are also conceivable as long as the rigidity of the thinned substrate layer is not impaired.

With the calibration markers being exposed together with the first areas through the same lithographic mask, the precision of the position of the calibration markers is increased and hence the accuracy of the arrangement of the transducers, which are to be positioned by means of the calibration markers relative to the cavities, is improved, e.g. in pressure sensors.

Beside the use of infrared microscopy in transmission, so far known, it is also possible to employ the incident light technique (in reflection) for detecting the calibration structures produced in accordance with the invention. The silicon usually employed as wafer material is transmissive, as a rule, in thin layers for red and infrared light. A silicon layer, 2 to 10 $\mu$m thick, appears dark brown against backlighting to the human eye. The cavities used in pressure sensors are not visible to the eye under the microscope with (wide-band) incident light. The cavities become visible only with dark field illumination. As the wave length increases, the light transmitting capacity of silicon undergoes a dramatic increase. The application of incandescent lamps, gas discharge lamps or lasers is possible for illuminating the calibration markers. With optical filters in the optical path a narrow-band range, e.g. at a wave length of 800 nm, can be selected from the spectral range of these lamps. A CCD camera is preferably used as receiver, which presents still a sufficient responsiveness within the aforementioned range. With an appropriate combination of light source, filter(s), thickness of layer and camera the structures in the oxide (as first layer) under the SOI layer can be clearly detected.

As silicon has a very high refractive index, e.g. of n=3.7 at 800 nm, a high fraction ($R_1$=33%) of the incident light is refracted already on the surface. The coefficient of absorption of non-doped silicon at this wave length amounts to roughly 0.1 $\mu m_{-1}$ and is reduced as the wave length increases. When the light must penetrate the thickness of the layer—e.g. of 5 $\mu$m—twice its intensity has been reduced to the $1/e^{th}$ fraction. Upon its exit from silicon to air the light undergoes another attenuation by the reflected fraction. At the lower interface from silicon to the oxide, the skip in the refractive index (from $n_{si}$=3.7 to $n_{oxide}$=1.5) equally results in a reflection of $R_2=(n_{si}-n_{oxide})^2/(n_{si}+n_{oxid6})^2$=18%. The intensity reflected in total is hence $I_{ges}$=(1-$R_1$)*(1/e)*$R_2$*(1-$R_1$)=3%. As this useful signal is weaker than the reflection on the first surface it is preferred that dark field illumination be applied.

In order to achieve a sufficient contrast the structure must present a distinct difference in terms of refractive index or absorption index from the surrounding material, or the structure will scatter the light to a noticeable extent from its original direction.

In the described method the contrast is produced by removal of the oxide from the lower interface of the silicon layer. Then the reflection at the transmission from silicon to air or vacuum is higher than $R^*_2$=33%. The intensity reflected in total hence becomes $I^*_{ges}$=5.5%. The structure hence appears brighter than the surrounding material. Additionally, the edges of the structures operate as scattering centres which appear clearly bright in dark field illumination.

In an improvement of the inventive method it is possible to fill the cavities used for calibration with a material increasing the contrast. With a metal filling, preferably of tungsten, the second reflection can be increased to 90%. However, along with this increase and also the following improvements an additional lithographic plane must be accepted because the cavities used for the sensor must not be filled or modified and must therefore be protected with photo resist before.

Another variant of the inventive method is the deeper etching of the cavities into the silicon layer, as may be seen in FIG. 3, for example. As the structured oxide is used as self-calibrating mask in this variant, a loss in calibration precision does not occur. The contrast-enhancing effect can be achieved in several ways.

The silicon layer can, on the one hand, be thinned by etching to such an extent that the absorption in the material becomes definitely lower. It appears to be sensible to reduce the thickness of the layer by half. This increases also the scattering effect of the edges, which is visible in a dark field. This means that with the thickness of the silicon layer, which is predetermined as a rule, the recesses for the calibration structures must achieve a certain depth.

Even a slight etching of the silicon layer only is suitable to result in a distinct contrast when the etched step corresponds to a change of the length of the optical path by one half of a wave length of the central wave length used for detection of the structures. This effect is known in microscopes as phase contrast technique or phase shifting effect. A height of the step of roughly 0.11 $\mu$m induces an extinguishing interference. The necessary prerequisite of the substantially mono-chromatic light is approximately satisfied by the application of an infrared filter. When polarisation filters are used the contrast can be even more enhanced in correspondence with the ellipsometer principle.

The same optical effect as that produced by a variation of the thickness of the silicon layer or the depth of the calibration structures can be achieved by ion implantation into the silicon layer. The structured oxide layer is used here as a mask for implantation. With a suitable selection of the penetrating depth and dose the refractive index of silicon in this region is just changed to such an extent that the length of the optical path is distinguished from the unchanged environment by one half of a wave length.

It is also possible to use another wave length in the range of roughly 750 to 1000 nm instead of an illumination wave length of 800 nm. The limit towards short wave lengths is given by the increased absorption in the visible range and the limit towards long wave lengths is defined by the sensitivity graph of the camera. The coefficient of absorption in silicon is distinctly reduced as the wave length is increased.

When other substrate materials are selected those skilled in the art are in a position to find corresponding other suitable wave lengths for illumination.

As the cavities used for calibration are not in the same plane as the structures in the photo resist, which are to be exposed, a possibly occurring parallax error can be compensated by a lateral lead in the mask.

The position of the structures produced in a lithographic process relative to the calibration markers can be checked, as usual, under the microscope with application of dark field illumination.

In the production of the silicon membrane it is also expedient to use SOI materials (silicon on Insulator materials). As in the thinning process a selective etch stops at the silicon surface the thickness of the membrane can be precisely maintained.

BRIEF DESCRIPTION OF THE DRAWINGS

The inventive method will be described again in the following by an embodiment, with reference to the drawing wherein:

FIGS. 1 to 3 are schematic view of an example of the realization of the inventive method; and FIGS. 4 to 6 illustrate the result of variants of the inventive method.

DETAILED DESCRIPTION OF THE INVENTION

The embodiment relates to the production of a pressure sensor of the type explained in the introduction to this specification. Such a pressure sensor consists of a cavity (10) under a thin silicon membrane (9) into which converter elements (11, FIG. 3) are integrated for the detection of the bending of the membrane.

In the production of this sensor according to the present embodiment, initially an SOI wafer is provided that consists of a substrate (6), a buried oxide (5) and a thin silicon layer (4). An oxide layer (3), roughly 1 $\mu$m thick, is produced as thermal oxide or deposited oxide on the SOI wafer. Then recesses (1 and 2) are produced in this oxide layer by means of a photo-lithographic process with subsequent etching, which may be performed as dry etching or wet etching process. The large-area recesses (2) serve later on as cavities for the sensor whilst the small recesses (1) serve as for calibration. The lateral structure for the large-area recesses (2) is therefore predetermined by the function or the desired properties of the sensor. The small recesses (1) are shaped in correspondence with the geometries of the calibration markers, which are required by the exposure device. As a rule, these are line-shaped or cruciform structures. Both types of recesses are produced by means of a common lithographic mask so that they will present a precise three-dimensional relationship with each other. In this example, the depth of the recesses corresponds to the thickness of the oxide layer. FIG. 1 shows only a section of the wafer that corresponds to a subsequent pressure sensor.

Then a second silicon wafer (12) (bulk wafer) is joined to the first wafer by bonding (silicon fusion bonding), as is illustrated in FIG. 2. With this operation the recesses (1, 2) become cavities (8, 10). Then the supporting or substrate layer (6) and the oxide layer (5) of the SOI wafer are removed by grinding, polishing (also CMP technique) or etching from the rear side. The second wafer (12) thus assumes the function of the bulk wafer. That part of the silicon layer (4), which is located above the large-area cavity (10), becomes the membrane (9) of the sensor. The surface of the silicon layer (4), which is exposed after removal of the substrate layer (6) and the oxide layer (5), can then be processed in the subsequent semiconductor production process for producing converter or transducer elements (1 1) such as piezo-resistive resistors therein. In this operation, the position of these transducer elements relative to the large-area cavities (10) can be precisely maintained by means of the calibration markers (8) and one of the optical exposure methods mentioned above (cf. FIG. 3).

The size of the recesses depends on the envisaged pressure area of the sensor in combination with the thickness of the silicon layer that is used as membrane. The required geometry, i.e. the lateral shape (square, elongate or round) of the cavities and the positions of the transducers can be calculated in advance and optimized by FEM (finite element method) simulation on the known elastic materials properties of silicon. In the application example, with a thickness of the silicon layer of 5 $\mu$m, square cavities with an edge length of roughly 200 $\mu$m are used.

FIG. 4 illustrates the result of a modification of the inventive method. Here, the same steps of operation are carried out on principle as those applied in the method according to FIGS. 1 and 2. The same reference numerals denote the same elements as n FIGS. 1 and 2 in this Figure and the following ones. The transducer elements are not illustrated n FIGS. 4 to 6.

As a matter of fact, however, in the variant according to FIG. 4 the recesses for the calibration markers are etched down to a depth below the depth of the recesses for the large-area cavities (10). This requires additional steps of method in which the recesses for the large-area cavities (10) are covered with a protective layer so that the cavities (13) for the calibration markers can be etched up into the silicon substrate. This protective layer must be removed again later on. The illustrated variant presents the advantage of a better detectability of the calibration markers from the surface.

FIG. 5 shows the result of another modification of the inventive method. Here the recesses (1) envisaged as calibration markers are filled with a metal (14) before the two wafers are joined. This results in an increase of the contrast, as has been set out in the foregoing.

FIG. 6 illustrates the result of a further variant of the inventive method. Here, the detectability of the calibration structures is enhanced by ion implantation (15) in the silicon layer (4). The recesses (1) in the oxide (3) serve as mask during the implantation step.

What is claimed is:

1. Method of producing calibration structures in semiconductor substrates in the production of components, comprising:

providing a first substrate on which a first layer is formed;

structuring said first layer to produce first areas which are required for functioning of the components;

joining said first substrate with a second substrate such that said first layer is enclosed between the first substrate and the second substrate; and thinning said first substrate or said second substrate down to a residual thickness; wherein said calibration structures are formed as second areas prior to joining said first substrate with said second substrate, said second areas penetrating completely through said first layer but not through said first substrate;

wherein said second areas constituting the calibration structures are not exposed upon thinning said first substrate or said second substrate, and the calibration structures have a refractive index different from a refractive index of adjoining areas for enhanced detectability of the calibration structures by an exposure device.

2. Method according to claim 1, wherein said second areas are produced as recesses in said first layer, and form cavities after joining of the first substrate and the second substrate.

3. Method according to claim 1, wherein said second areas are produced as recesses in said first layer, and are filled with a material having a greater difference than air in terms of refractive index relative to adjoining regions in a further step prior to joining said first substrate and said second substrate.

4. Method according to claim 2 or 3, wherein said first areas are produced as recesses constituting a cavity after said first substrate and said second substrate have been joined.

5. Method according to claim 4, wherein said recesses of said second areas are formed when said recesses in said first areas are formed.

6. Method according to claim 2 or 3, wherein said recesses of said second areas are produced to extend up into said first substrate.

7. Method according to claim 6, wherein said recesses of said second areas are produced up to a depth which penetrates into said first substrate, and which corresponds to a length of an optical path in the first substrate of half a wavelength of a monochromatic light to be used for detecting the calibration structures.

8. Method according to claim 1, further comprising a step preceding joining of said first substrate and said second substrate including ion implantation in said first substrate at a site of said recesses of said second areas up to a depth corresponding to a length of an optical path in said first substrate of half a wavelength of a monochromatic light to be used for detecting the calibration structures, with said first layer serving as a mask for ion implantation.

9. Method according to claim 1, wherein said calibration structures are produced as two-dimensional by groove-shaped recesses in a side-by-side arrangement.

10. Method according claim 1, wherein said first layer is an oxide layer and/or nitride layer.

11. Method according to claim 1, wherein said first substrate and/or said second substrate is a silicon substrate.

12. Method according to claim 1, wherein said first substrate and/or said second substrate is an SOI substrate.

13. Method according to claim 1, wherein the thinning is carried out by grinding, polishing, CMP or etching.

* * * * *